US009608660B2

(12) United States Patent
Vohora

(10) Patent No.: US 9,608,660 B2
(45) Date of Patent: Mar. 28, 2017

(54) DIGITAL-TO-ANALOG CONVERTER WITH SWITCHING ELEMENTS CONTROLLED BY A MICROCONTROLLER

(71) Applicant: Renesas Electronics Europe GmbH, Duesseldorf (DE)

(72) Inventor: Bushan Vohora, Bourne End (GB)

(73) Assignee: RENESAS ELECTRONICS EUROPE GMBH, Duesseldorf (DE)

( * ) Notice: Subject to any disclaimer, the term of this patent is extended or adjusted under 35 U.S.C. 154(b) by 0 days.

(21) Appl. No.: 14/783,321

(22) PCT Filed: Apr. 3, 2014

(86) PCT No.: PCT/EP2014/056707
§ 371 (c)(1),
(2) Date: Oct. 8, 2015

(87) PCT Pub. No.: WO2014/166809
PCT Pub. Date: Oct. 16, 2014

(65) Prior Publication Data
US 2016/0065233 A1 Mar. 3, 2016

(30) Foreign Application Priority Data
Apr. 8, 2013 (EP) .................................. 13162748

(51) Int. Cl.
H03M 1/66 (2006.01)
H03M 1/82 (2006.01)
H03M 1/06 (2006.01)

(52) U.S. Cl.
CPC ......... H03M 1/661 (2013.01); H03M 1/0626 (2013.01); H03M 1/82 (2013.01); H03M 1/668 (2013.01)

(58) Field of Classification Search
CPC .............................. H03M 1/822; H03M 1/661
(Continued)

(56) References Cited

U.S. PATENT DOCUMENTS 5,980,708 A * 11/1999 Champagne ........... G01N 27/48
   204/400
7,907,074 B2 * 3/2011 Zanchi ................ H03M 1/0863
   323/268

(Continued)

OTHER PUBLICATIONS

Mitchell, Mike, "Using PWM Timer_B as a DAC," Dec. 2000.
(Continued)

*Primary Examiner* — Peguy Jean Pierre
(74) *Attorney, Agent, or Firm* — Nelson Mullins Riley & Scarborough LLP

(57) ABSTRACT

A digital-to-analog converter (DAC) is described. The DAC comprises a resistor having a resistance R and a capacitor having a capacitance C. The DAC comprises a first switching element configured, in response to a first control signal, to couple the capacitor to a first rail via a path having a resistance less than R and a second switching element configured, in response to a second control signal, to couple the capacitor to the first rail through the resistor. The DAC also comprises a third switching element configured, in response to a third control signal, to couple the capacitor to a second rail (8) via a path having a resistance less than R and a fourth switching element configured, in response to a responsive to a fourth control signal, to couple the capacitor to the second through the resistor. The capacitor can be quickly charged or discharged over a period less than RC or less than 0.7 RC. The DAC may comprise a first control element configured to switch on the second switching element before switching on the first switching element and a second control element configured to switch on the fourth switching element before switching on the third switching element.

22 Claims, 14 Drawing Sheets

(58) Field of Classification Search
USPC .................. 341/144, 143, 118, 155, 150
See application file for complete search history.

(56) References Cited

U.S. PATENT DOCUMENTS

| | | | | |
|---|---|---|---|---|
| 8,704,691 | B2* | 4/2014 | Zabroda | G11C 27/026 |
| | | | | 341/122 |
| 9,035,680 | B2* | 5/2015 | Yang | H03K 5/2481 |
| | | | | 327/215 |
| 2002/0171575 | A1 | 11/2002 | Marten | |
| 2004/0246158 | A1* | 12/2004 | Leung | H03M 1/1057 |
| | | | | 341/155 |
| 2009/0167325 | A1* | 7/2009 | Geaghan | G01D 5/24 |
| | | | | 324/660 |
| 2013/0003995 | A1* | 1/2013 | Poulsen | H03F 1/0272 |
| | | | | 381/121 |
| 2014/0361914 | A1* | 12/2014 | Singh | H03K 17/223 |
| | | | | 341/155 |

OTHER PUBLICATIONS

Alter, David M., "Using PWM Output as a Digital-to-Analog Converter on a TMS320F280x Digital Signal Controller," Sep. 2008.
Nisarga, Bhargavi, "PWM DAC Using MSP430 High-Resolution Timer," Jul. 2011.
International Search Report and Written Opinion of PCT/EP2014/056707 mailed Apr. 29, 2014.

* cited by examiner

|  | T1 | T2 | Vout | Q1 | Q2 | Q3 | Q4 |
|---|---|---|---|---|---|---|---|
| UP | 0 | 0 | Vcc | ON | ON | OFF | OFF |
|  | 1 | 0 | Adjustment up | OFF | ON | OFF | OFF |
| DOWN | 0 | 1 | Adjustment down | OFF | OFF | OFF | ON |
|  | 1 | 1 | 0 | OFF | OFF | ON | ON |

Fig. 2

| | RC discharge $V_{out} = V_{in}e^{-t/RC}$ | RC charge $V_{out} = V_{in}(1-e^{-t/RC})$ |
|---|---|---|
| t = 0 | $V_{out} = V_{in}$ | $V_{out} = 0$ |
| t = 0.7RC | $V_{out} = 0.5\ V_{in}$ | $V_{out} = 0.5\ V_{in}$ |
| t = RC | $V_{out} = 0.368\ V_{in}$ | $V_{out} = 0.632\ V_{in}$ |
| t = 2RC | $V_{out} = 0.135\ V_{in}$ | $V_{out} = 0.865\ V_{in}$ |
| t = 3RC | $V_{out} = 0.05\ V_{in}$ | $V_{out} = 0.95\ V_{in}$ |

Fig. 3

DIGITAL-TO-ANALOG CONVERTER WITH SWITCHING ELEMENTS CONTROLLED BY A MICROCONTROLLER

The present invention relates to a digital-to-analog converter.

Microcontrollers are widespread and are frequently used to monitor, control or communicate with analog signal devices.

Most microcontrollers have an integrated analog-to-digital converter (ADC) module which allows them to convert an analog input signal into a digital signal. However, many microcontrollers do not include an integrated digital-to-analog converter (DAC) module.

Notwithstanding this, pulse-width modulation (PWM) can be used to implement a DAC using a microcontroller. A microcontroller timer module generates a PWM signal which is fed into an analog low-pass filter resulting in an output signal, $V_{out}$, having a dc component. The dc voltage level of the output signal, $V_{out}$, is directly proportional to the duty cycle of the PWM signal. Thus, the microcontroller can adjust the dc voltage level by varying the duty cycle. Examples of PWM DACs are described in "PWM DAC Using MSP430 High-Resolution Timer", Texas Instruments Application Report SLAA497 (July 2011), "Using PWM Output as a Digital-to-Analog Converter on a TMS320F280x Digital Signal Controller", Texas Instruments Application Report SPRAA88A (September 2008) and "Using PWM Timer_B as a DAC", Texas Instruments Application Report SLAA116 (December 2000).

A PWM DAC has n-bit resolution, i.e. capable of providing $2^n$ output levels, such that:

$$2^n = f_{CLK}/f_{PWM} \quad (1)$$

where $f_{CLK}$ is the frequency of a timer clock used to increment a timer counter and $f_{PWM}$ is the frequency of the PWM signal. Thus, DAC resolution can be increased by increasing $f_{CLK}$ and/or by decreasing $f_{PWM}$.

Although PWM can be used to implement a simple, low-cost DAC, PWM DACs generally suffer from having poor resolution and low bandwidth.

DAC resolution can be lost due to ripple uncertainty particularly as $f_{PWM}$ decreases and approaches the filter cut-off frequency, $f_C$. For example, if $f_{CLK}$=128 MHz, $f_{PWM}$=2 MHz and $f_C$=10 kHz, then a PWM DAC is expected to have a resolution of 6 bits. Simulation of PWM DAC performance shows that the effective DAC resolution is about that expected. If PWM signal frequency, $f_{PWM}$, is reduced by an order of magnitude to 200 kHz, then the PWM DAC is expected to exhibit a higher resolution, namely 9 bits. However, simulation shows that the effective DAC resolution is less than 3 bits, i.e. 6 bits below the expected DAC resolution.

Voltage ripple and, thus, ripple uncertainty can be decreased by using a higher-order filter. However, this increases settling time of the filter, which can be as long as 1 second.

If $f_{PWM}$ is high (e.g. >1 MHz) and a high resolution is desired (e.g. >8 bits), then a timer clock frequency, $f_{CLK}$, greater than 200 MHz is needed. However, most microcontrollers are not provided with such fast timers.

The present invention seeks to provide an improved DAC.

According to a first aspect of the present invention there is provided digital-to-analog converter comprising a resistor having a resistance R and a capacitor having a capacitance C. The digital-to-analog converter comprises a first switching element configured, in response to a first control signal, to couple the capacitor to a first rail (for example, a positive voltage supply rail) via a path having a resistance less than R and a second switching element configured, in response to a second control signal, to couple the capacitor to the first rail through the resistor. The digital-to-analog converter comprises a third switching element configured, in response to a third control signal, to couple the capacitor to a second rail (for example, a ground rail) via a path having a resistance less than R and a fourth switching element configured, in response to a responsive to a fourth control signal, to couple the capacitor to the second voltage rail through the resistor.

Thus, the capacitor can be quickly charged or discharged over a period less than RC or less than 0.7 RC.

The digital-to-analog converter may comprise a first control element configured to switch on the second switching element before switching on the first switching element and a second control element configured to switch on the fourth switching element before switching on the third switching element.

Switching on the second switching element before the first switching element and switching on the fourth switching element before the second switching element can help to reduce or avoid a damaging current spike through the first and second switching elements when charging and discharging the capacitor respectively.

The first control element may switch on the second switching element at least 1 ns, at least 2 ns or at least 5 ns before switching on the first switching element. The first control element may switch on the second switching element no more than 50 ns, no more than 20 ns or no more than 10 ns before switching on the first switching element.

The second control element may switch on the fourth switching element at least 1 ns, at least 2 ns or at least 5 ns before switching on the third switching element. The second control element may switch on the fourth switching element no more than 50 ns, no more than 20 ns or no more than 10 ns before switching on the third switching element.

The first control element may be configured to switch on the second switching element before switching on the first switching element when the first control element is in a first state (e.g. an UP state) and the second control element may be configured to switch on the second switching element before switching on the first switching element when the second control element is in a second state (e.g. a DOWN state).

The digital-to-analog converter can provide high resolution, for example at least 8 bits, even if a timer clock frequency of 64 MHz is used. The digital-to-analog converter can exhibit a settling time of less than 4 μs and no more than 0.1% ripple at maximum output voltage.

A control signal may be a HIGH pulse, i.e. going from LOW to HIGH (for a given duration) to LOW. A control signal may be a LOW pulse, i.e. going from HIGH to LOW (for a given duration) to HIGH.

The first switching element may be configured to couple the capacitor directly to the first rail. The third switching element may be configured to couple the capacitor directly to the second rail.

The digital-to-analog converter may comprise a single capacitor between the first and second rails.

The first control element may be configured to provide the first control signal in dependence upon the second control signal (for example, a first timer signal, T1) and a fifth control signal (for example, an adjust up signal, UP). The first control element may comprise a logic gate, for example, an OR gate.

The digital-to-analog converter may comprise a first path between a control signal input (for example, an input for the second control signal) and a control terminal of the first switching element (for example, a gate of a transistor) via an element which introduces a first delay (for example, the first control element) and a second path between the control signal input and a control terminal of the second switching element (for example, a gate of transistor) without an element which introduces a delay or via an element which introduces a delay less than the first delay.

The second control element may be configured to provide the third control signal in dependence upon the fourth control signal (for example, a second timer signal, T2) and a sixth control signal (for example, an adjust down signal, DOWN). The second control element may comprise a logic gate, for example an AND gate.

The digital-to-analog converter may comprise a third path between another control signal input (for example, an input for the fourth control signal) and a control terminal of the third switching element (for example, a gate of a transistor) via another element which introduces a second delay (for example, the second control element) and a fourth path between the control signal input and a control terminal of the fourth switching element (for example, a gate of transistor) without an element which introduces a delay or via an element which introduces a delay less than the second delay.

The first and second delays may be substantially the same duration.

The first and second control elements may introduce first and second delays respectively. The first and/or second delay(s) may be at least 1 ns, at least 2 ns or at least 5 ns. The first and/or second propagation delay(s) may be no more than 50 ns, no more than 20 ns or no more than 10 ns.

The first and third switching elements may be arranged in a push-pull configuration. The first and third switching elements may comprise first and third transistors. The first and third transistors may comprise bipolar junction transistors. The first and third switching elements may be of opposite types, e.g. one may be an npn transistor and the other may be a pnp transistor.

The second and fourth switching elements may be arranged in a push-pull configuration. The second and fourth switching elements may comprise second and fourth transistors. The second and fourth transistors may comprise bipolar junction transistors. The second and fourth switching elements may be of opposite types, e.g. one may be an npn transistor and the other may be a pnp transistor.

According to a second aspect of the present invention there is provided apparatus comprising the digital-to-analog converter and a circuit arranged to provide or to cause generation of the control signals. A control signal is applied for a duration less than RC or less than 0.7 RC.

The circuit may comprise an integrated circuit. The integrated circuit may comprise a microcontroller.

According to third aspect of the present invention there is provided of controlling a digital-to-analog converter comprising a resistor having a resistance R, a capacitor having a capacitance C and switch configured, in response to a control signal, to couple the capacitor to a rail (for example, a positive voltage supply rail, a negative voltage rail or to ground) through the resistor, the method comprising applying the control signal for a duration less than RC.

The method may comprise, when the capacitor is in a discharged state, initially charging the capacitor through the resistor for a given time period and then charging the capacitor via a path having a resistance less than R and, when the capacitor is in charged state, initially discharging the capacitor through the resistor for a given time period and then charging the resistor via a path having a resistance less than R The path having a resistance less than R is preferably provided in parallel with the resistor.

The charged state may be a partially-charged state.

The given time period may be at least 1 ns, at least 2 ns or at least 5 ns. The given time period may be no more than 50 ns, no more than 20 ns or no more than 10 ns.

The method may comprise applying the control signal for a duration less than 0.7 RC.

The digital-to-analog converter may comprises a first switching element configured, in response to a first control signal, to couple the capacitor to a first rail via a path having a resistance less than R, a second switching element configured, in response to a second control signal, to couple the capacitor to the first voltage rail through the resistor, a third switching element configured, in response to a third control signal, to couple the capacitor to a second rail via a path having a resistance less than R, and a fourth switching element configured, in response to a fourth control signal, to couple the capacitor to the second rail through the resistor, wherein the method may comprises applying the first, second, third or fourth control signal for a duration less than RC.

Certain embodiments of the present invention will now be described, by way of example, with reference to the accompanying drawings, in which:

FIG. 2 is a table showing timer signal states and adjust signal states, output voltage responses and transistor states for the circuit shown in FIG. 1;

FIG. 3 is a table listing times and output voltages when charging and discharging the capacitor C through the resistor R9 shown in FIG. 1;

In the following description, like parts are denoted by like reference numerals.

Figure 1:
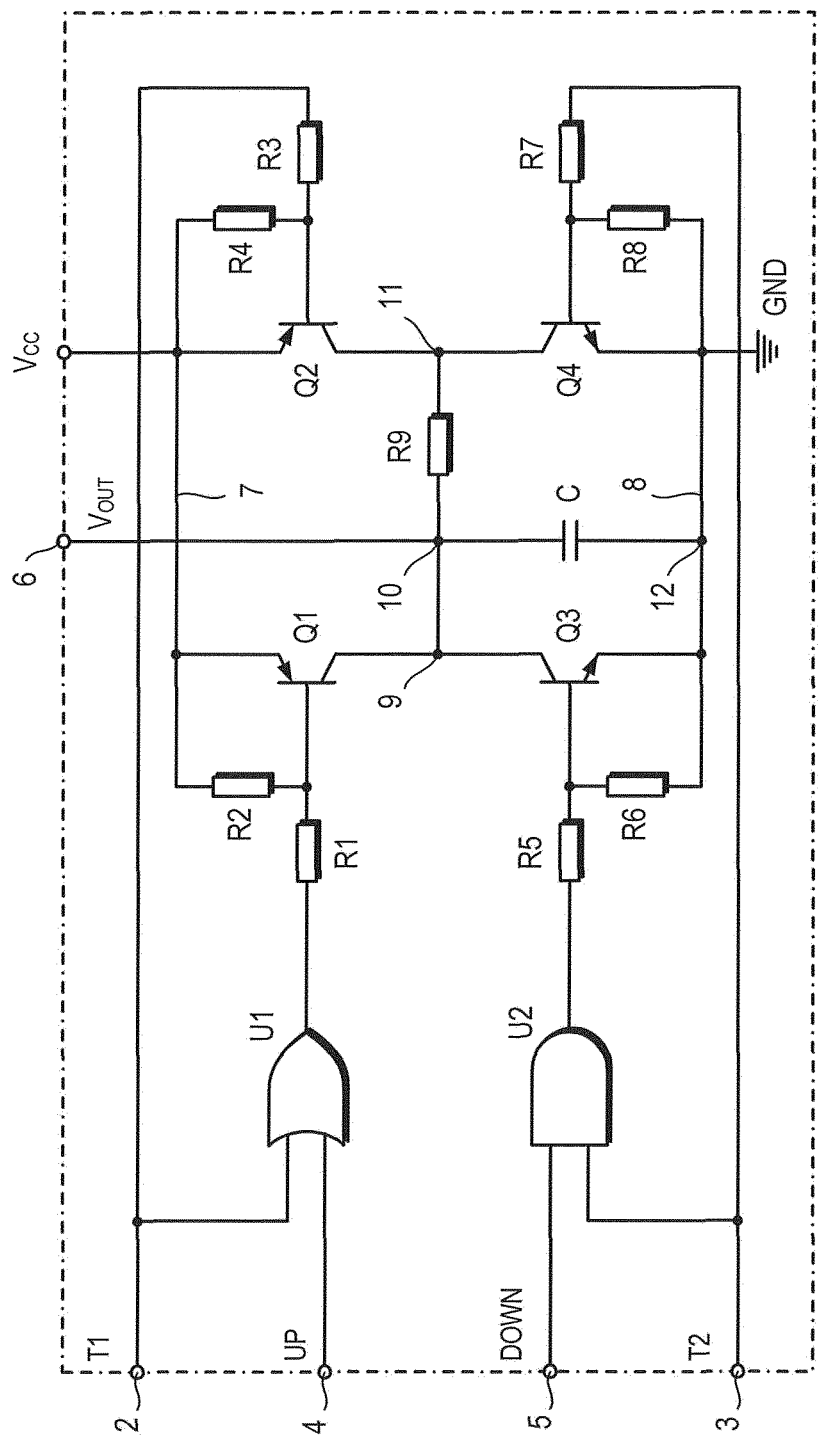
FIG. 1 shows a circuit including a capacitor C for generating an analog output voltage, a resistor R9 and first, second, third and forth transistors Q1, Q2, Q3, Q4 used to charge and discharge the capacitor C.

Referring to FIG. 1, a circuit 1 is shown for implementing a DAC.

The circuit 1 includes first and second timer signal input terminals 2, 3 which receive first and second timer signals T1, T2, first and second switch up and switch down selection signal input terminals 4, 5 which receive switch up and switch down selection signals UP, DOWN and an analog signal output terminal 6 which provides an analog signal $V_{OUT}$.

The timer signals T1, T2 (in this case, 16-bit timer signals) can be generated by an external timer using a timer clock having a frequency, $f_{CLK}$, of 64 MHz. With a timer period of 16 µs, 10-bit resolution can be achieved. The external timer can be provided by a microcontroller.

The first timer input terminal 2 and the switch up terminal 4 are connected to the inputs of a 2-input OR gate U1. The second timer input terminal 3 and the switch down terminal 5 are connected to the inputs of a 2-input AND gate U2. The OR gate U1 takes the form of a Fairchild Semiconductor® TinyLogic® ultra high speed two-input OR gate (NC7SZ32) and the AND gate U2 takes the form of a Fairchild Semiconductor® TinyLogic® high speed two-input AND gate (NC7S08). The OR and AND gates U1, U2 have respective propagation times, $t_{PL1}$, $t_{PL2}$.

The output of the OR gate U1 is connected via a first resistor R1 to the base of a first transistor Q1 in the form of a pnp bipolar transistor. The base of the first transistor Q1 is pulled up to supply voltage, $V_{CC}$, via a second resistor R2. In this case, the supply voltage $V_{CC}$ is 5 V. The emitter of the first transistor Q1 is tied to the supply voltage, $V_{CC}$. The first transistor Q1 takes the form of a Fairchild Semiconductor® PNP Epitaxial Silicon Transistor (BC327). The first resistor R1 has a resistance value of 510Ω and the second resistor R2 has a resistance value of 90Ω.

The first timer input terminal 2 is connected via a third resistor R3 to the base of a second transistor Q2 in the form of a pnp bipolar transistor. The base of the second transistor Q2 is pulled up to supply voltage, $V_{CC}$, via a fourth resistor R4. The emitter of the second transistor Q2 is tied to the supply voltage, $V_{CC}$. The second transistor Q2 takes the form of a Fairchild Semiconductor® PNP Epitaxial Silicon Transistor (BC327). The third resistor R3 has a resistance value of 510Ω and the fourth resistor R4 has a resistance value of 90Ω.

The output of the AND gate U2 is connected via fifth resistor R5 to the base of a third transistor Q3 in the form of an npn bipolar transistor. The base of the third transistor Q3 is pulled down to ground via a sixth resistor R6. The emitter of the third transistor Q3 is tied to ground. The third transistor Q3 takes the form of a Fairchild Semiconductor® PNP Epitaxial Silicon Transistors (BC337). The fifth resistor R5 has a resistance value of 510Ω and the sixth resistor R6 has a resistance value of 90Ω.

The second timer input terminal 3 is connected via a seventh resistor R7 to the base of a fourth transistor Q4 in the form of an npn bipolar transistor. The base of the forth bipolar transistor Q4 is pulled down to ground via an eighth resistor R8. The emitter of fourth transistor Q4 is tied to ground. The fourth transistor Q4 takes the form of a Fairchild Semiconductor® PNP Epitaxial Silicon Transistors (BC337). The seventh resistor R7 has a resistance value of 510Ω and the eighth resistor R8 has a resistance value of 90Ω.

The first and third transistors Q1, Q3 are arranged in series in a totem pole configuration, without any pull up or pull down resistors, between a first rail 7 which is connected to positive supply voltage $V_{CC}$ and second rail 8 which is connected to ground GND. The second rail 8 can be connected to negative supply voltage $V_{EE}$ instead of ground GND. The collectors of the first and third transistors Q1, Q3 are connected at a first node 9. The first node 9 is connected to a second node 10 which is connected to the output terminal 6.

The second and fourth transistors Q2, Q4 are arranged in series in a totem pole configuration, without any pull up or pull down resistors, between the first and second rails 7, 8. The collectors of the second and fourth transistors Q2, Q4 are connected at a third node 11. The second and third nodes 10, 11 are connected via a ninth resistor R9. The ninth resistor R9 has a resistance value of 510Ω.

A capacitor C is connected between the second node 10 and a fourth node 12 which lies on or is connected to the second rail 8. The capacitor C has a capacitance value of 22 pF.

Referring also to FIG. 2, output of the capacitor C can be switched up to $V_{CC}$ by the first and second transistors Q1, Q2 switching ON and can be switched down to 0V by third and fourth transistors Q3, Q4 switching ON. The propagation delays through the OR gate U1 and AND gate U2 allows the second and fourth transistors Q2, Q4 to switch ON earlier than (approximately 9 ns before) the first and third transistors Q1, Q3 and so avoid a damaging current spike through the first and third transistors Q1, Q3.

As will be explained in more detail hereinafter, in switch up and switch down modes, the first and third transistors Q1, Q3 can be used to achieve a very quick transition (of the order of a few microseconds) to $V_{CC}$ or to 0V. In adjustment mode, the second and fourth transistors Q2, Q4 are used to adjust the output voltage, $V_{OUT}$, at output terminal 6 to the required level.

Figure 4:
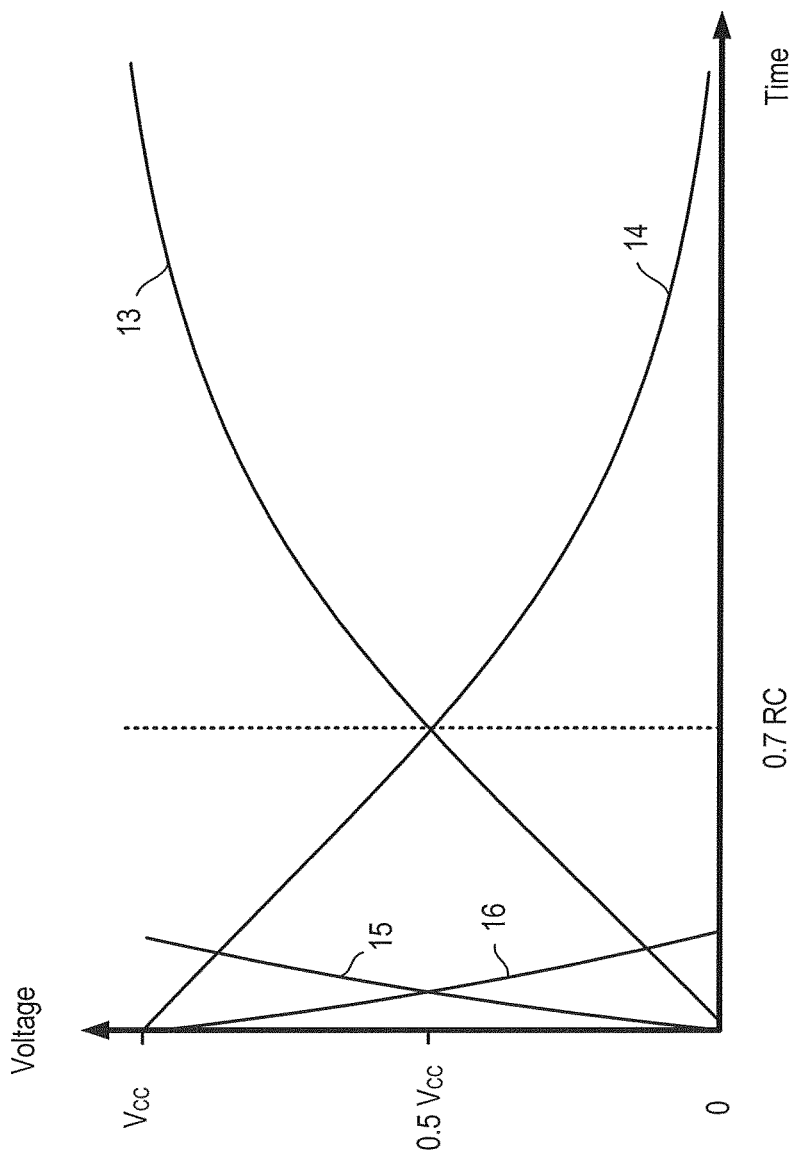
FIG. 4 is a graph showing output voltages against time.

Referring to FIGS. 1, 3 and 4, the largest change in voltage across the capacitor C occurs when the capacitor C charges from 0V to $0.5V_{CC}$ and when it discharges from $V_{CC}$ to $0.5V_{CC}$.

A first response curve 13 shows the voltage across the capacitor C as it is charged through the second transistor Q2 and ninth resistor R9. A second response curve 14 shows the voltage across the capacitor C as it is discharged through the fourth transistor Q4 and ninth resistor R9.

A third response curve 15 shows the voltage across the capacitor C when it is charged by the first transistor Q1 in switch up mode. A fourth response curve 16 shows voltage across the capacitor C when it is discharged by the third transistor Q3 in switch down mode.

The first response curve 13 is nearly linear when the capacitor C is charged from 0V to $0.5V_{CC}$. Likewise, the second response curve 14 is nearly linear when the capacitor C is discharged from $V_{CC}$ to $0.5V_{CC}$. This can be used to achieve a very fast transition time and a simple calculation can be used to calculate an ON time to achieve a required output voltage.

Charging and discharging to reach a required output voltage can be achieved in single charging or discharging cycle from a discharged or charged state. Charging is not dependant on charge integration over a multiple cycles. Once the required voltage has been achieved, the transistors Q1, Q2, Q3, Q4 are switched OFF, minimising charge drain from the capacitor C. The output voltage, $V_{OUT}$, can be monitored and, if necessary, adjusted using the second and fourth transistors Q2, Q4.

To achieve a fast transition time, a small RC time constant is used. However, the value of capacitance is chosen not to be too small because for small values, charge leakage has a larger effect on the output voltage, $V_{OUT}$, since V=Q/C. Thus, the capacitance value of the capacitor C is chosen to be at least 15 pF.

The circuit 1 can be operated in two ways. Whichever method is used, the circuit 1 can be used to achieve a quick response. Charging/discharging occurs in a period lasting less than 0.7 RC. Thus, timer signals T1, T2 and switch up and switch down signals are applied for periods less than 0.7 RC. In this case RC=11 µs. The circuit 1 also benefits from little ripple voltage.

First Method of Operation

A first method of operating the circuit 1 will be explained with reference to FIG. 5.

Figure 5:
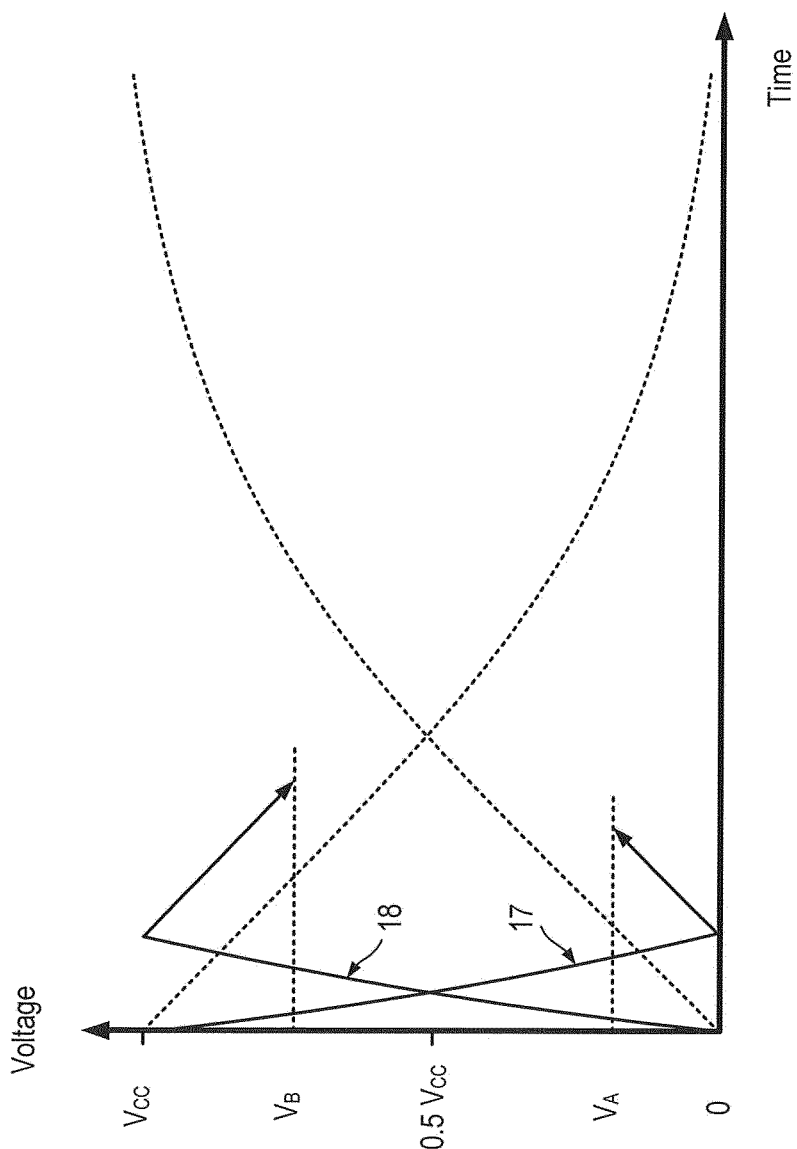
FIG. 5 is a graph showing output voltages against time.

Referring to FIG. 5, if a voltage $V_A$ is required which lies between 0V and $0.5V_{CC}$, then the capacitor C is reset, i.e. completely discharged by switch down, and then charged to reach the required voltage $V_A$ following path 17. If a voltage $V_B$ is required which lies between $0.5V_{CC}$ and $V_{CC}$, then the capacitor C is set, i.e. charged to $V_{CC}$ by switch up, and then discharged to the required voltage $V_B$ following path 18.

Apparatus for controlling the circuit 1 using the first method of operation will now be described with reference to FIGS. 6 and 7.

Figure 6:
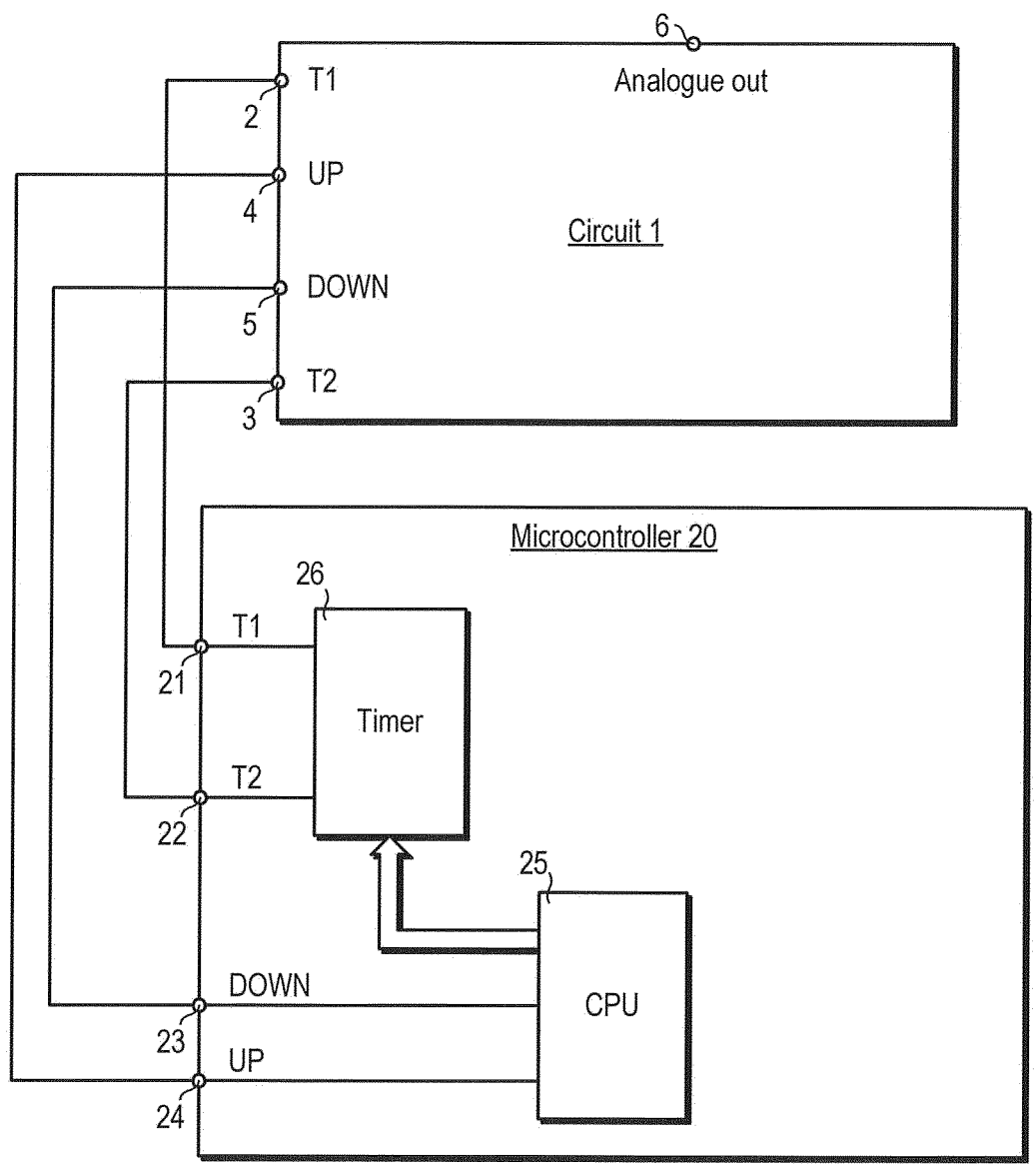
FIG. 6 is a schematic block diagram of the circuit shown in FIG. 1 and a microcontroller.
Figure 7:
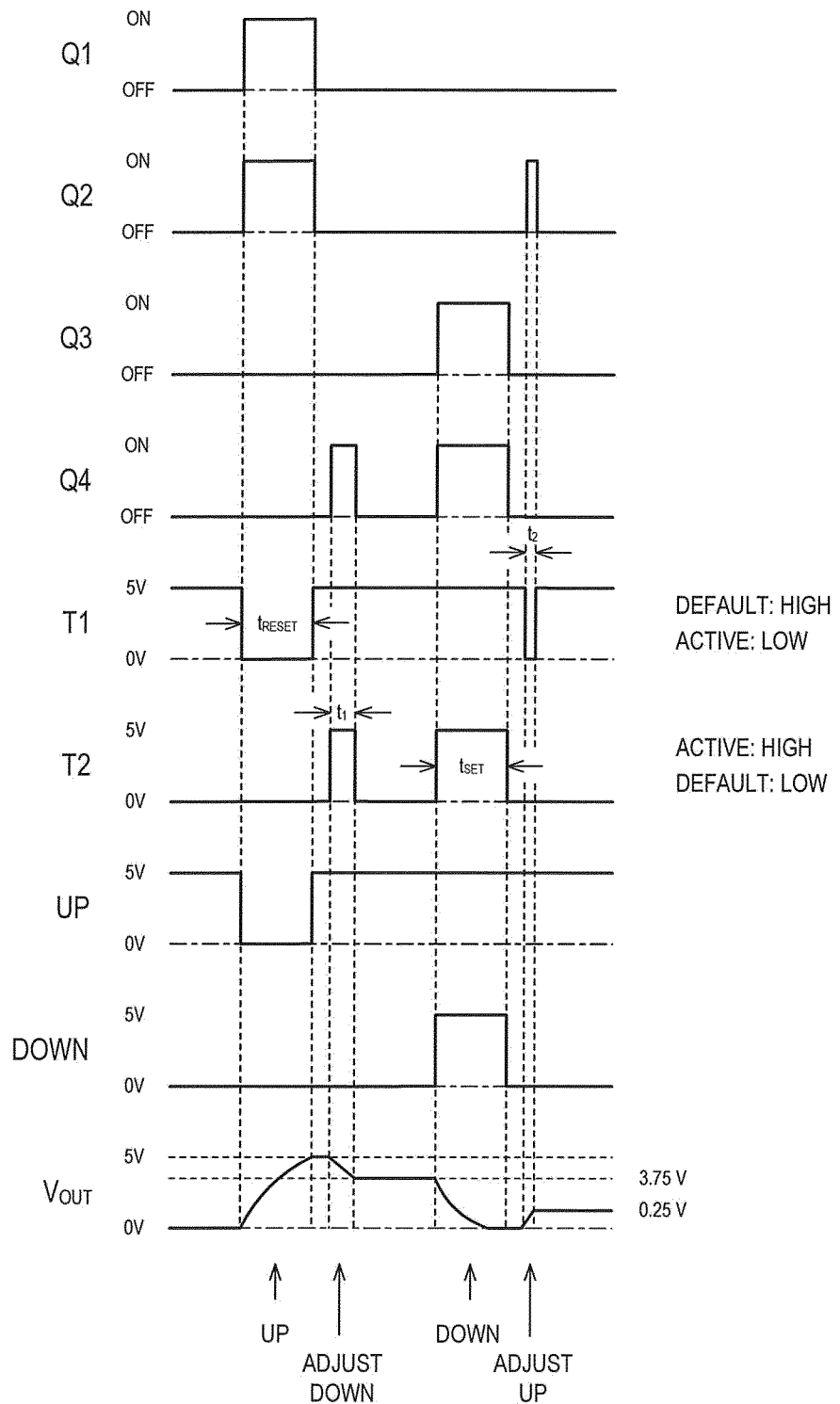
FIG. 7 is a timing chart illustrating a first method of operation of the circuit shown in FIG. 1.

Referring to FIG. 6, the circuit 1 can be controlled using a microcontroller 20 which generates first and second timer signals T1, T2 and first and second switch up and switch down signals UP, DOWN. The DEFAULT and ACTIVE values of the first timer signal T1 are HIGH and LOW respectively. The DEFAULT and ACTIVE values of the second timer signal T2 are LOW and HIGH respectively.

The microcontroller 20 includes first and second timer signal output terminals 21, 22 which supply the first and second timer signals T1, T2 and first and second general purpose digital input/output terminals 23, 24 which supply the switch up and switch down signals UP, DOWN. The timer module 26 generates the first and second timer signals T1, T2 which are output via timer signal output terminals 21, 22 and supplied to the first and second timer input terminals 2, 3 of the DAC circuit 1.

The microcontroller 20 may be, for example, a member of the Renesas Electronics® RL 78® family, such as the RL78/I1A.

The microcontroller 20 includes a central processing unit (CPU) 25 running application software (not shown) and a timer module 26.

The CPU 25 controls the timer module 26 and generates appropriate switch up and switch down signals UP, DOWN.

Referring to FIGS. 1, 2, 6 and 7, operation of the circuit 1 and the microcontroller 20 will now be described.

In an initial state, the capacitor C is discharged and the analog output signal $V_{OUT}$ is 0V.

When the first and second timer signals T1, T2 have default values, i.e. HIGH and LOW values respectively, and the switch up and switch down signals UP, DOWN are LOW, then the transistors Q1, Q2, Q3, Q4 are OFF.

Application software (not shown) sets a reference voltage $V_{REF}$, for example 3.75 V (i.e. $0.75 \times V_{CC}$). The application software (not shown) determines that 3.75 V is greater than $0.5 \times V_{CC}$ and so determines that the capacitor C should be first charged to $V_{CC}$ using switch up and then partially discharged through the ninth resistor R9.

Set ($V_{CC}$)

Under control of the application software (not shown), the CPU 25 resets (i.e. brings LOW) the first timer signal T1 and the switch up signal UP. Thus, the first and second transistors Q1, Q2 are switched ON. The second transistor Q2 is switched on slightly before the first transistor Q1 due to propagation delay through the OR gate U1. The first timer signal T1 and the switch up signal UP are kept LOW for a duration, $t_{RESET}$, which is sufficiently long to charge capacitor C to $V_{CC}$. For example, $t_{RESET}$=5 µs.

Adjust Down

The CPU 25 calculates using a simple linear equation (not shown) or uses a look-up table (not shown) a duration, $t_1$, of pulse needed to reduce the voltage across the capacitor by 1.25 V (i.e. 5V-3.75 V).

The CPU 25 sets (i.e. drives HIGH) the second timer signal T2 for the duration, $t_1$. Thus, the fourth transistor Q4 is switched ON which causes the capacitor C to start discharging. When the timer signal T2 is reset, discharging of the capacitor stops.

Application software (not shown) sets a reference voltage $V_{REF}$, for example 0.25 V. The application software (not shown) determines that 0.25 V is less than $0.5 \times V_{CC}$ and so determines that the capacitor C should be first discharged to 0V using switch down and then partially charged through the ninth resistor R9.

Reset (0V)

Under control of the application software (not shown), the CPU 25 sets (i.e. brings HIGH) the second timer signal T2 and the switch down signal DOWN. Thus, the third and fourth transistors Q3, Q4 are switched ON. The second timer signal T2 and the switch down signal DOWN are kept LOW for a duration, $t_{SET}$, which is sufficiently long to discharge the capacitor C to 0V. For example, $t_{SET}$=5 µs.

Adjust Down

The CPU 25 calculates using a simple linear equation (not shown) or uses a look-up table (not shown) a duration, $t_2$, of pulse needed to charge the capacitor such that the voltage is 0.25 V.

The CPU 25 resets (i.e. brings LOW) the first timer signal T1 for the duration, $t_2$. Thus, the second transistor Q2 is switched ON which causes the capacitor C to start charging. When the timer signal T1 is returned to DEFAULT value (i.e. HIGH), charging of the capacitor ceases.

Thus, a required analog voltage output $V_{OUT}$ can be achieved quickly, i.e. within a few microseconds.

A microcontroller need not be used. For example, a timer integrated circuit (not shown) and a logic circuit (not shown) may be used instead.

Second Method of Operation

A second method of operating the circuit 1 is to employ rapid charging and discharging using switch up and switch down, i.e. to use switch up and switch down to charge and discharge the capacitor C partially without the need for setting or resetting (i.e fully charging or discharging) the capacitor C. For example, the second method can be used to charge the capacitor C from 0V or from a low voltage (e.g. 0.5 V) to a value greater than $0.5V_{CC}$ (e.g. 4.5V) directly. This is possible because the circuit 1 has a quick response. For example, the circuit 1 has a response time of 3.5 μs for a transition from 0 V to 4.5 V.

Apparatus for controlling the circuit 1 using the second method of operation will now be described with reference to FIGS. 8 and 9.

Figure 8:
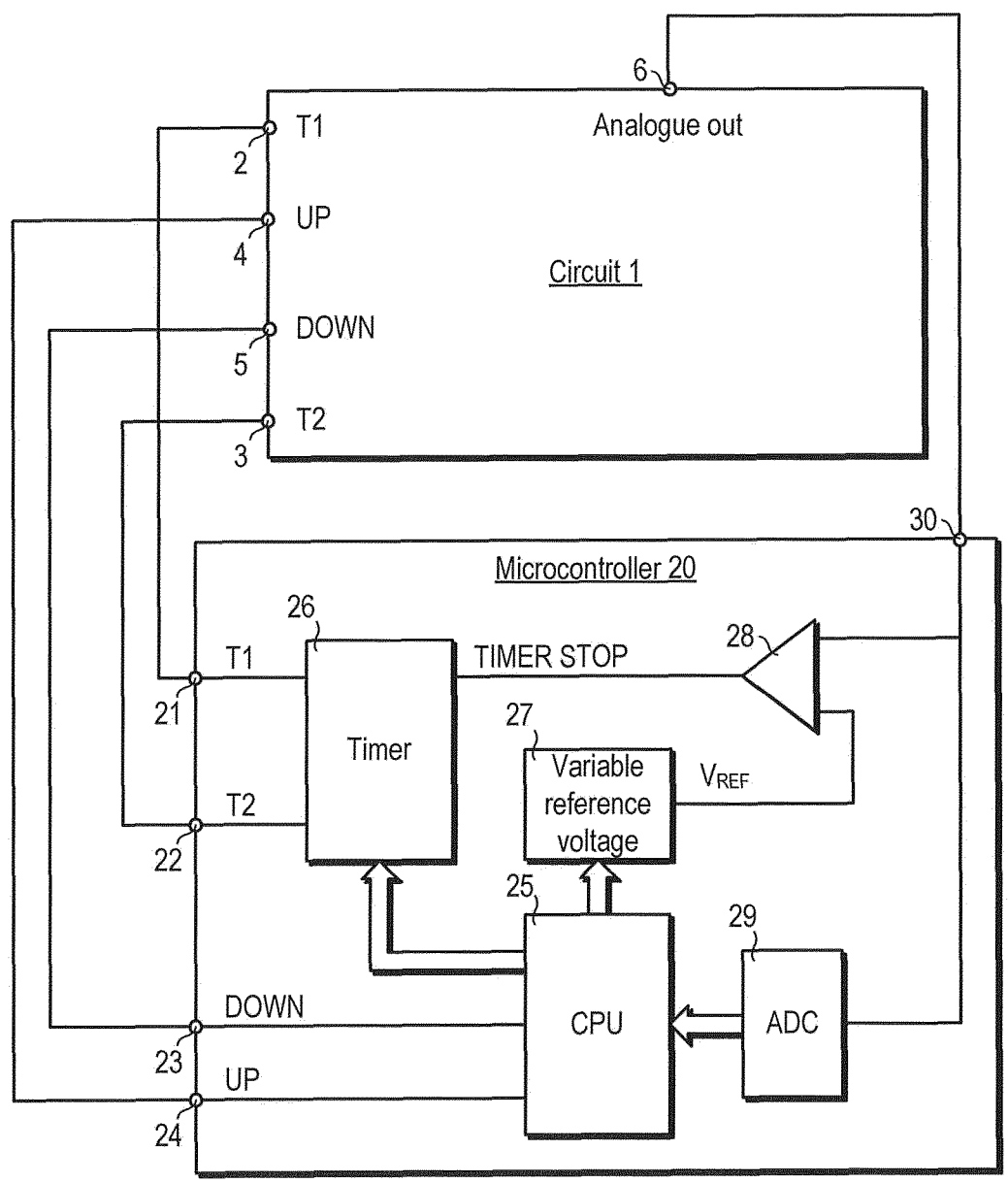
FIG. 8 is a schematic block diagram of the circuit shown in FIG. 1 and a microcontroller.
Figure 9:
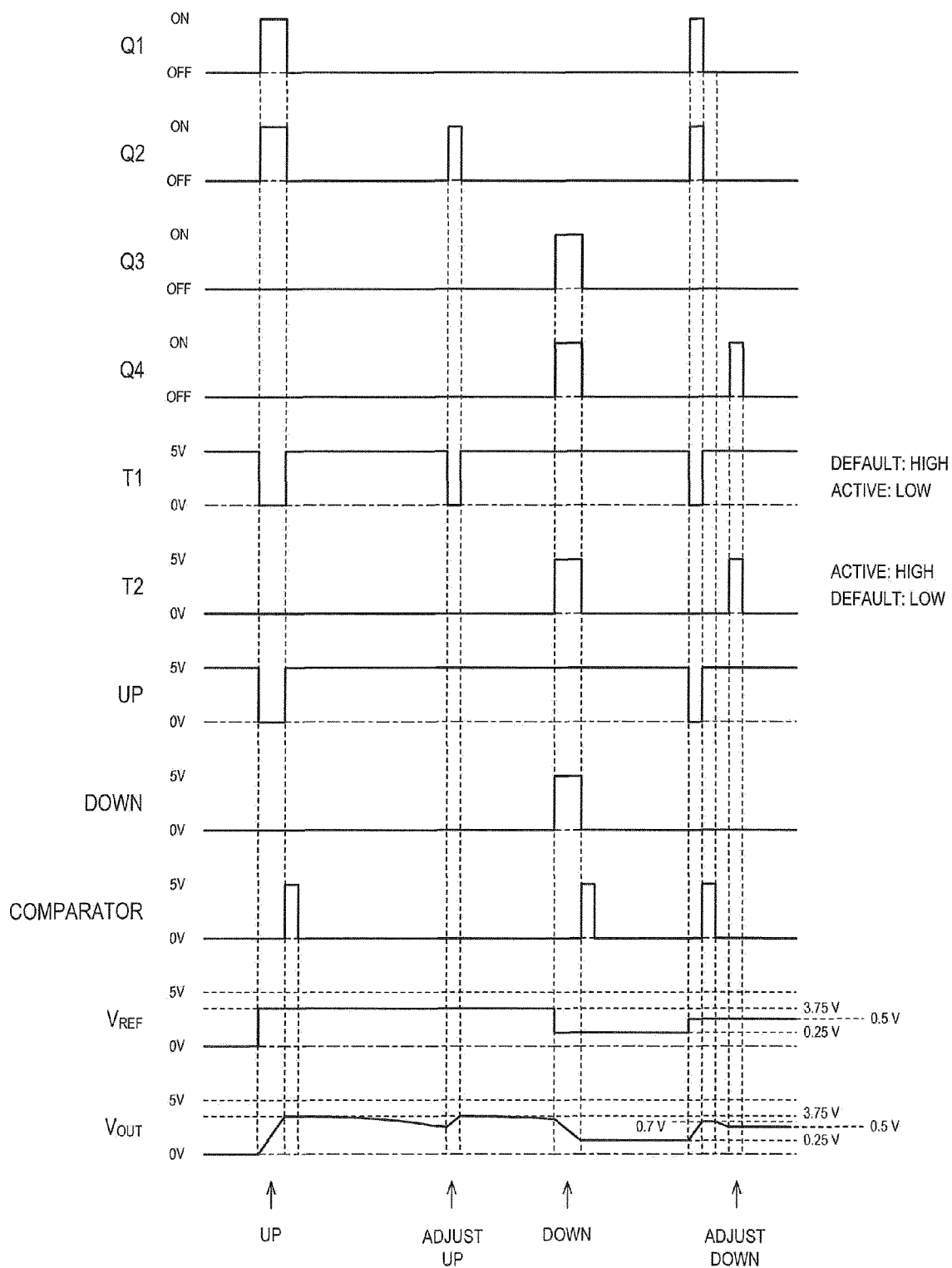
FIG. 9 is a timing chart illustrating a second method of operation of the circuit shown in FIG. 1.

Referring to FIG. 8, the circuit 1 is controlled using the microcontroller 20 using first and second timer signals T1, T2 and first and second switch up and switch down signals UP, DOWN using the microcontroller 20. The DEFAULT and ACTIVE values of the first timer signal T1 are HIGH and LOW respectively. The DEFAULT and ACTIVE values of the second timer signal T2 are LOW and HIGH respectively.

The microcontroller 20 includes a central processing unit (CPU) 25 running application software (not shown), a timer module 26, a variable reference voltage module 27, a comparator 28 and an analog-to-digital converter (ADC) module 29. The ADC module 29 has a resolution which is the same or greater than the resolution the resolution as the DAC circuit. In this case, the ADC module 29 has 10-bit resolution. The microcontroller 20 includes an analog signal input terminal 30.

The CPU 25 sets the required voltage and generates appropriate switch up and switch down signals UP, DOWN.

The CPU 25 sets the required voltage $V_{REF}$ using the variable reference voltage module 27 which is used to supply the analog reference voltage $V_{REF}$ to the comparator 28. The comparator 28 generates an interrupt, TIMER STOP, which controls the timer module 26. The timer module 26 generates the first and second timer signals T1, T2 which are output via timer signal output terminals 21, 22 and supplied to the first and second timer input terminals 2, 3 of the DAC circuit 1.

The timer module 26 is used to output a pulse with an ACTIVE time calculated to achieve the required voltage.

To improve the accuracy of the DAC circuit 1, the analog output voltage $V_{OUT}$ can be measured using the ADC module 29 and then adjusted to make any corrections.

The DAC circuit 1 ameliorates the problem of high ripple voltage without using high-order filters and offers a high resolution and fast settling times without the need for a very high frequency timer clock.

Referring to FIGS. 1, 2, 7 and 8, operation of the circuit 1 and microcontroller 20 will now be described.

In an initial state, the capacitor C is discharged and the analog output signal $V_{OUT}$ is 0V.

When the first and second timer signals T1, T2 have default values, i.e. HIGH and LOW values respectively, and the first and second switch up and switch down signals UP, DOWN are LOW, then the transistors Q1, Q2, Q3, Q4 are OFF.

Switch Up

Application software (not shown) sets a reference voltage $V_{REF}$, for example 3.75 V (i.e. $0.75 \times V_{CC}$). Under control of the application software (not shown), the CPU 25 resets (i.e. brings LOW) the first timer signal T1 and the switch up signal UP and passes the value $V_{REF}$ to the variable reference voltage module 27. In response, the first and second transistors Q1, Q2 are switched ON (the second transistor Q2 is switched on slightly before the first transistor Q1) and the analog output signal $V_{OUT}$ begins to increase.

The analog output signal $V_{OUT}$ is fed back to the microcontroller 20 and is supplied to the comparator 28 and to the ADC module 29. The ADC module 29 polls $V_{OUT}$ and periodically supplies a digital value of the measurement to the CPU 25.

The output of the comparator 28 remains low while the analog output signal $V_{OUT}$ and reference voltage signal $V_{REF}$ are unequal. Thus, the first timer T1 remains LOW.

When the analog output signal $V_{OUT}$ equals the reference voltage signal $V_{REF}$, the comparator 28 generates an interrupt in the form of a HIGH pulse which stops the first timer T1, i.e. the first timer T1 is set (i.e. goes HIGH). Under control of the application software (not shown), the CPU 25 sets (i.e. brings HIGH) the switch up signal UP. Thus, the first and second transistors Q1, Q2 are switched OFF.

Adjust Up

The ADC module 29 continues to poll the analog output signal $V_{OUT}$ and the CPU 25 carries on monitoring the analog output signal $V_{OUT}$. If the CPU 25 determines that $V_{OUT}$ has dropped below a threshold value (due to the capacitor discharging), then the CPU 25 resets (i.e. brings LOW) the first timer signal T1. In response, the second transistor Q2 is switched ON. The capacitor C is charged through the ninth requestor R9 so and the analog output signal $V_{OUT}$ begins to increase.

When the analog output signal $V_{OUT}$ equals the reference voltage signal $V_{REF}$, the CPU 25 stops the first timer T1, thereby switching off the second transistor Q2. This process can continued to provide fine adjustment of the analog output signal $V_{OUT}$.

Switch Down

Application software (not shown) sets a new reference voltage $V_{REF}$, for example 0.25 V (i.e. $0.05 \times V_{CC}$). Under control of the application software (not shown), the CPU 25 sets (i.e. drives HIGH) the second timer signal T2 and the switch down signal DOWN and passes the value $V_{REF}$ to the variable reference voltage module 27. In response, the third and fourth transistors Q3, Q4 are switched ON (the fourth transistor Q4 is switched on slightly before the third transistor Q3) and the analog output signal $V_{OUT}$ begins to decrease.

The analog output signal $V_{OUT}$ is fed back to the microcontroller 61 and is supplied to the comparator 28 and to the ADC module 29. The ADC module 29 polls $V_{OUT}$ and periodically supplies a digital value of the measurement to the CPU 25.

The output of the comparator 28 remains low while the analog output signal $V_{OUT}$ and reference voltage signal $V_{REF}$ are unequal. Thus, the first timer T2 remains HIGH.

When the analog output signal $V_{OUT}$ equals the reference voltage signal $V_{REF}$, the comparator 28 generates an interrupt in the form of a HIGH pulse which stops the second timer T2, i.e. the second timer T2 is reset (i.e. brought LOW). Under control of the application software (not shown), the CPU 25 resets (i.e. brings LOW) the switch down signal DOWN. Thus, the third and fourth transistors Q3, Q4 are switched OFF.

The ADC module 29 continues to poll the analog output signal $V_{OUT}$ and the CPU 25 carries on monitoring the analog output signal $V_{OUT}$. If the CPU 25 determines that $V_{OUT}$ has dropped below a threshold value (due to the capacitor discharging), then the CPU 25 can adjust the analog output signal $V_{OUT}$ as hereinbefore described.

When the analog output signal $V_{OUT}$ equals the reference voltage signal $V_{REF}$, the CPU 25 stops the first timer T1, thereby switching off the second transistor Q2. This process can continued to provide fine adjustment of the analog output signal $V_{OUT}$.

Switch Up and Adjust Down

A combination of fast switching up and slow adjustment down can be used to reach a required voltage level.

Application software (not shown) sets a reference voltage $V_{REF}$, for example 0.5 V (i.e. 0.1×$V_{CC}$). Under control of the application software (not shown), the CPU 25 resets (i.e. brings LOW) the first timer signal T1 and the switch up signal UP and passes the value $V_{REF}$ to the variable reference voltage module 27. In response, the first and second transistors Q1, Q2 are switched ON and the analog output signal $V_{OUT}$ begins to increase.

The analog output signal $V_{OUT}$ is fed back to the microcontroller 81 and is supplied to the comparator 28 and to the ADC module 29. The ADC module 29 polls $V_{OUT}$ and periodically supplies a digital value of the measurement to the CPU 25.

The output of the comparator 28 remains low while the analog output signal $V_{OUT}$ and reference voltage signal $V_{REF}$ are unequal. Thus, the first timer T1 remains LOW.

When the analog output signal $V_{OUT}$ equals the reference voltage signal $V_{REF}$, the comparator 28 generates an interrupt in the form of a HIGH pulse which stops the first timer T1, i.e. the first timer T1 is set (i.e. goes HIGH). Under control of the application software (not shown), the CPU 25 sets (i.e. brings HIGH) the switch up signal UP. Thus, the first and second transistors Q1, Q2 are switched OFF.

If the CPU 25 determines that the analog output signal $V_{OUT}$ has overshot, then it can use fine adjustment to reduce the value.

The CPU 25 sets (i.e. drives HIGH) the second timer signal T2. In response, the fourth transistor Q4 is switched ON. The capacitor C is discharged through the ninth requestor R9 so and the analog output signal $V_{OUT}$ begins to decrease.

When the analog output signal $V_{OUT}$ equals the reference voltage signal $V_{REF}$, the CPU 25 stops the second timer T2, thereby switching off the fourth transistor Q4.

In this case, the voltage ripple arises due to the feedback loop time, i.e. not due to a filter circuit. The ripple voltage is small and is of the order of microvolts.

Examples

Operation of the circuit 1 and microcontroller 20 will now be illustrated with reference to FIGS. 10 to 20.

Figure 10:
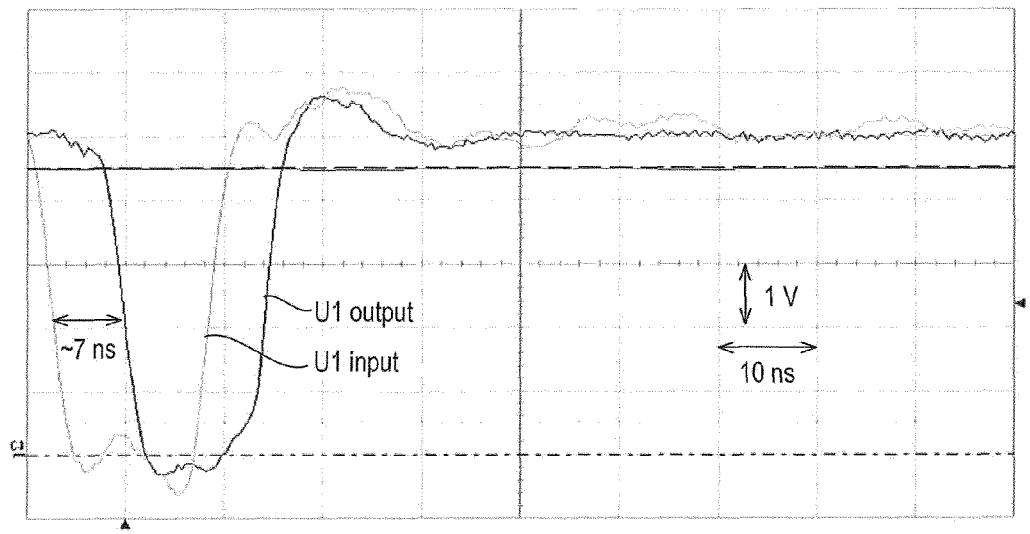
FIG. 10 shows plots of input and output signals for an OR gate illustrating propagation delay.

FIG. 10 shows the input and output of the OR gate U1 (FIG. 1). As shown in FIG. 8, the output of the OR gate U1 (FIG. 1) is delayed by approximately 7 ns compared to the input.

Figure 11:
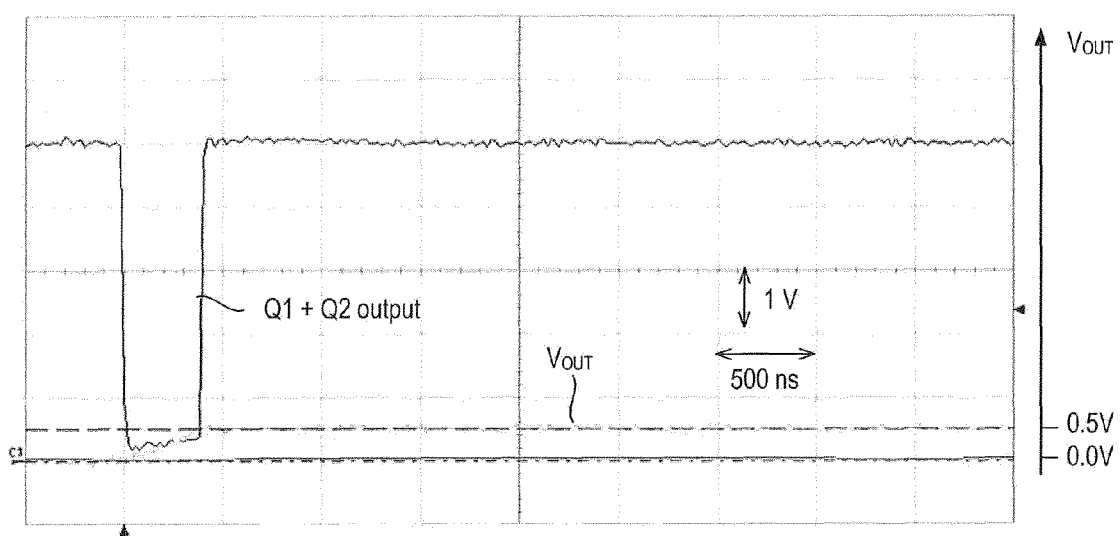
FIG. 11 shows plots of measured responses of the combined output of the first and second transistors and the capacitor shown in FIG. 1 when charging from 0V to 0.5 V.

FIG. 11 shows plots of voltage against time of the combined output of the first and second transistors Q1, Q2 and the voltage output, $V_{OUT}$, when charging from 0V to 0.5 V. As shown in FIG. 9, voltage output, $V_{OUT}$, increases while the first and second transistors Q1, Q2 are OFF and remains steady (with little ripple voltage) when the first and second transistors Q1, Q2 are ON.

Figure 12:
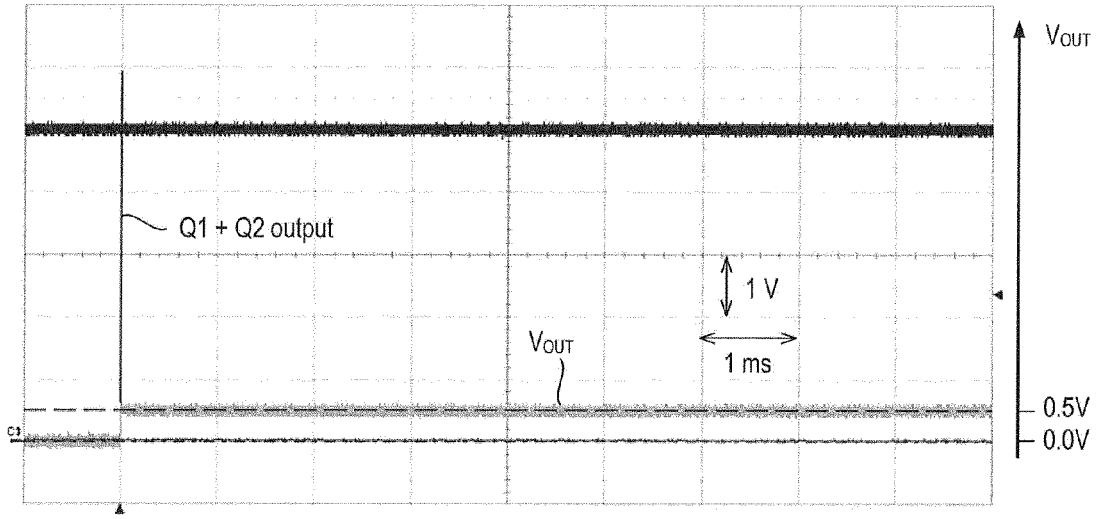
FIG. 12 shows plots of measured responses of the combined output of the first and second transistors and the capacitor shown in FIG. 1 when charging from 0V to 0.5 V.

FIG. 12 shows plots of voltage against time of the combined output of the first and second transistors Q1, Q2 and the voltage output, $V_{OUT}$, when charging from 0V to 0.5 V over a longer period of time.

Figure 13:
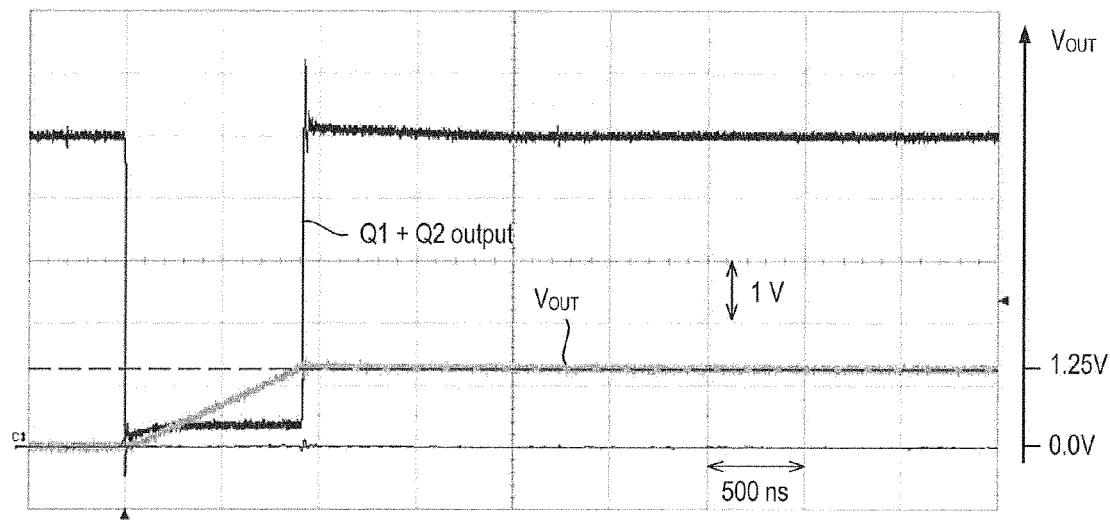
FIG. 13 shows plots of responses of the combined output of the first and second transistors and the capacitor shown in FIG. 1 when charging from 0V to 1.25 V.

FIG. 13 shows plots of voltage against time of the combined output of the first and second transistors Q1, Q2 and the voltage output, $V_{OUT}$, when charging from 0V to 1.25 V.

As shown in FIG. 13, voltage output, $V_{OUT}$, increases linearly while the first and second transistors Q1, Q2 are OFF and remains steady, with little ripple when the first and second transistors Q1, Q2 are ON.

Figure 14:
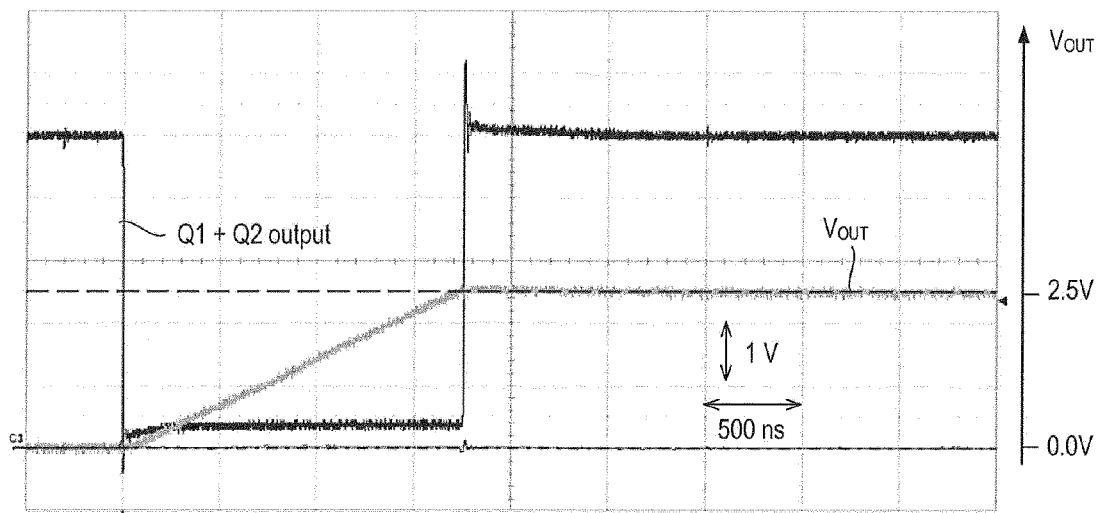
FIG. 14 shows plots of measured responses of the combined output of the first and second transistors and the capacitor shown in FIG. 1 when charging from 0V to 2.5 V.

FIG. 14 shows plots of voltage against time of the combined output of the first and second transistors Q1, Q2 and the voltage output, $V_{OUT}$, when charging from 0V to 2.5 V.

Figure 15:
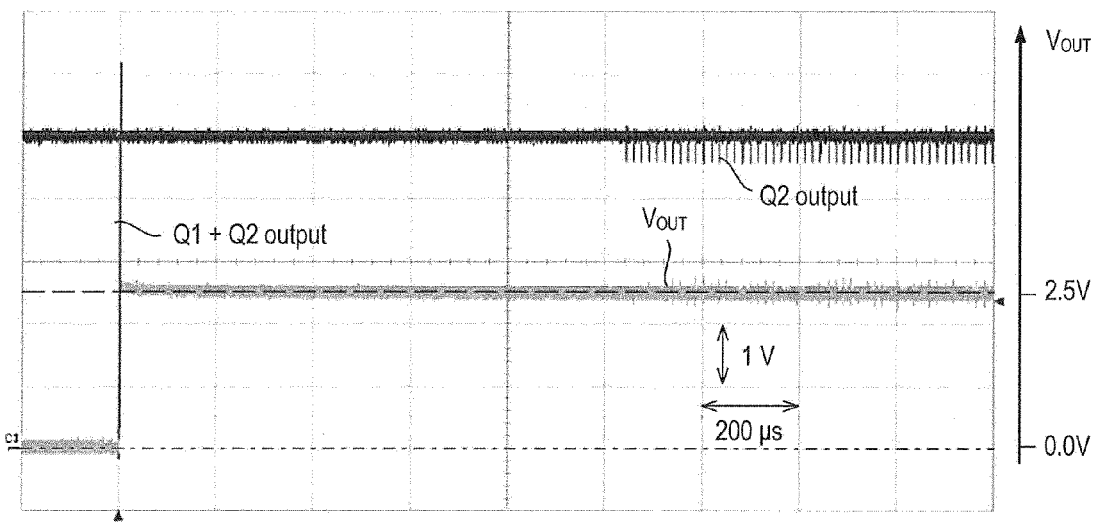
FIG. 15 shows plots of measured responses of the combined output of the first and second transistors and the capacitor shown in FIG. 1 when charging from 0V to 2.5 V and adjusted by the second transistor.

FIG. 15 shows plots of voltage against time of the combined output of the first and second transistors Q1, Q2 and the voltage output, $V_{OUT}$, when charging from 0V to 2.5 V and adjusted by the second transistor.

Figure 16:
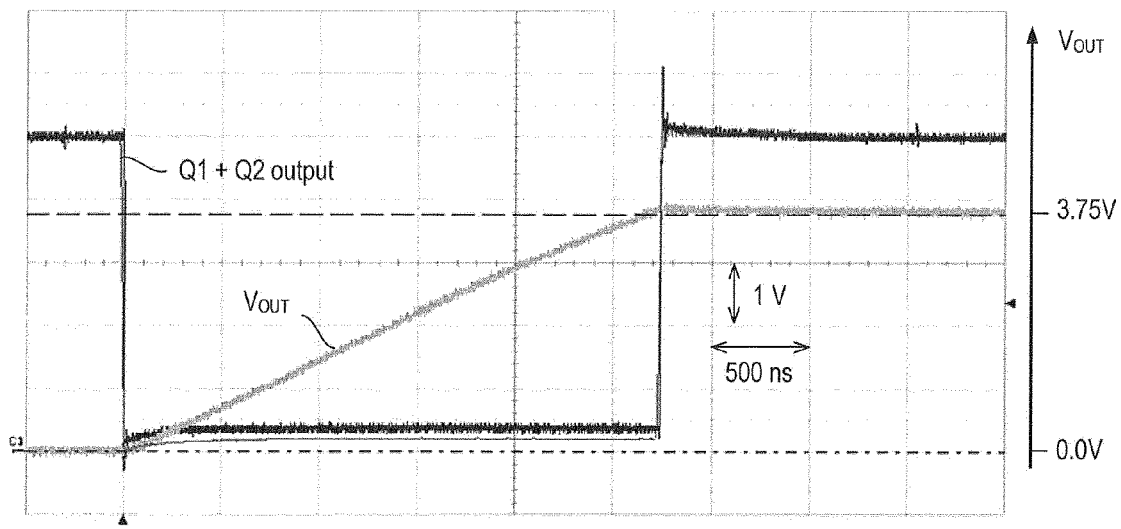
FIG. 16 shows plots of measured responses of the combined output of the first and second transistors and the capacitor shown in FIG. 1 when charging from 0V to 3.75 V.

FIG. 16 shows plots of voltage against time of the combined output of the first and second transistors Q1, Q2 and the voltage output, $V_{OUT}$, when charging from 0V to 3.75 V.

Figure 17:
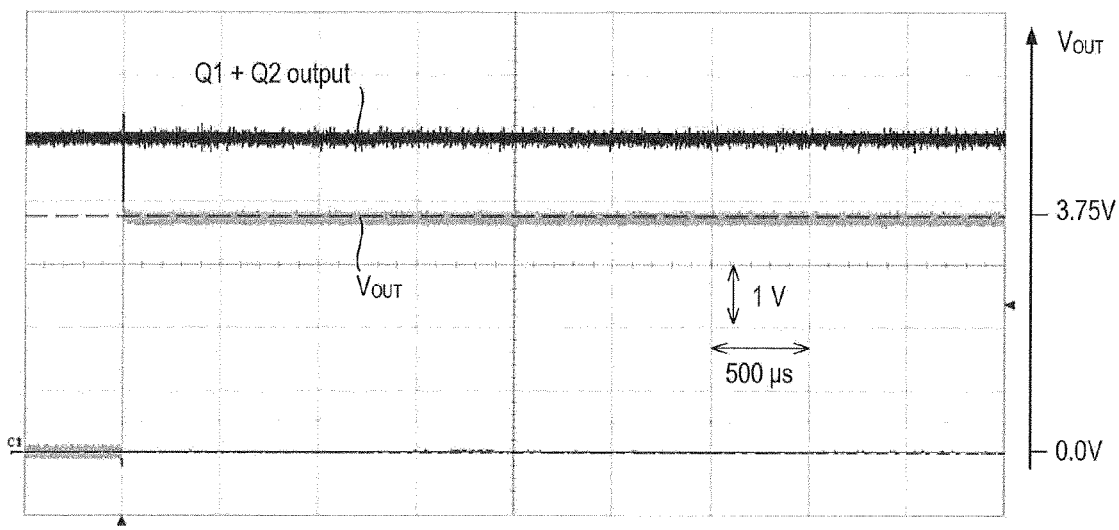
FIG. 17 shows plots of measured responses of the combined output of the first and second transistors and the capacitor shown in FIG. 1 when charging from 0V to 3.75 V.

FIG. 17 shows plots of voltage against time of the combined output of the first and second transistors Q1, Q2 and the voltage output, $V_{OUT}$, when charging from 0V to 3.75 V over a longer period of time.

Figure 18:
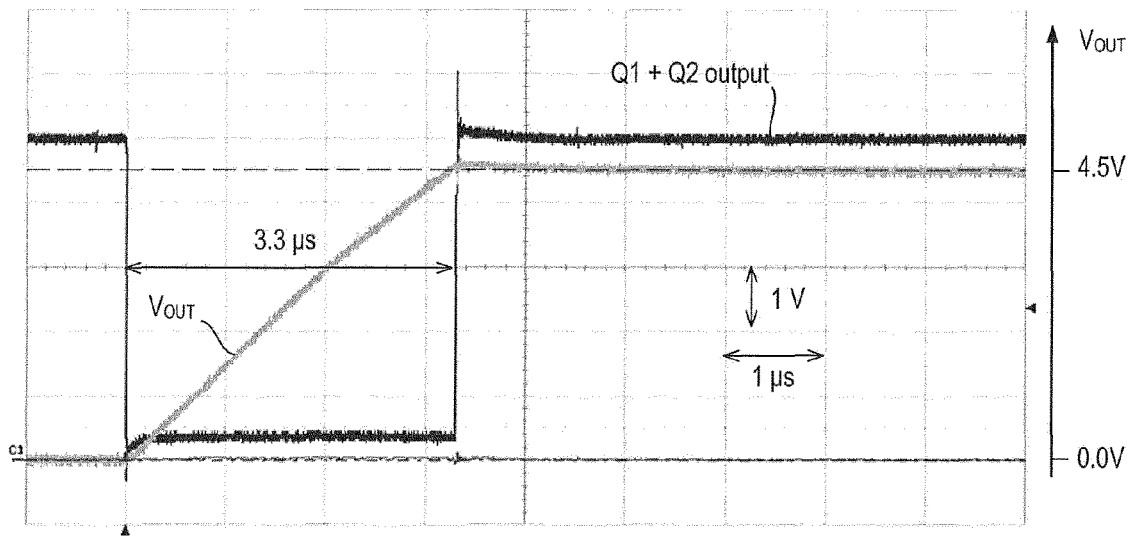
FIG. 18 shows plots of measured responses of the combined output of the first and second transistors and the capacitor shown in FIG. 1 when charging from 0V to 4.5 V.

FIG. 18 shows plots of voltage against time of the combined output of the first and second transistors Q1, Q2 and the voltage output, $V_{OUT}$, when charging from 0V to 4.5 V.

Figure 19:
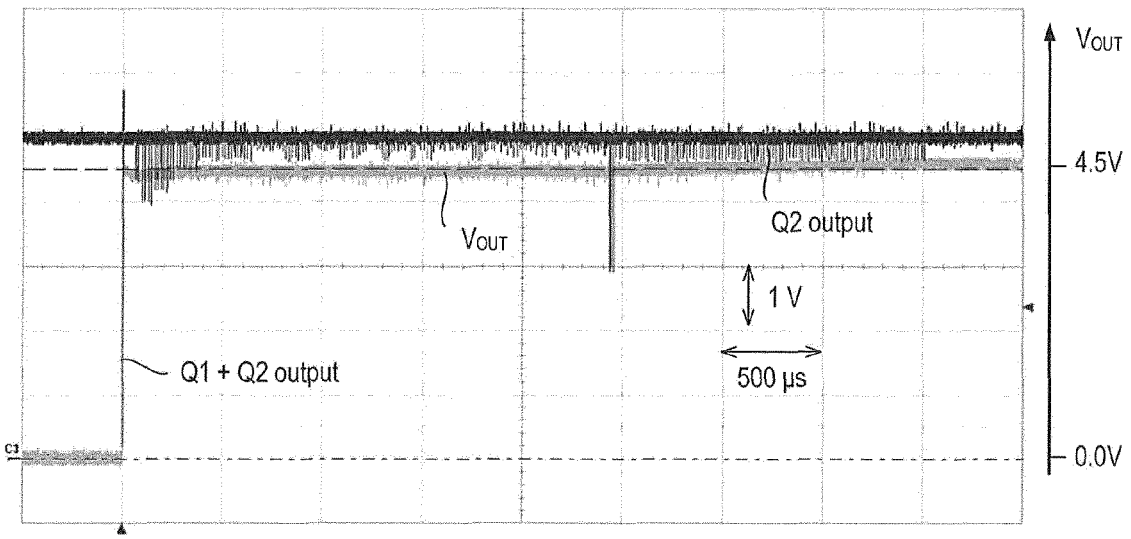
FIG. 19 shows plots of measured responses of the combined output of the first and second transistors and the capacitor shown in FIG. 1 when charging from 0V to 4.5 V and adjusted by the second transistor.

FIG. 19 shows plots of voltage against time of the combined output of the first and second transistors Q1, Q2 and the analog voltage output, $V_{OUT}$, when charging from 0V to 4.5V and then adjusted by the second transistor Q2.

Figure 20:
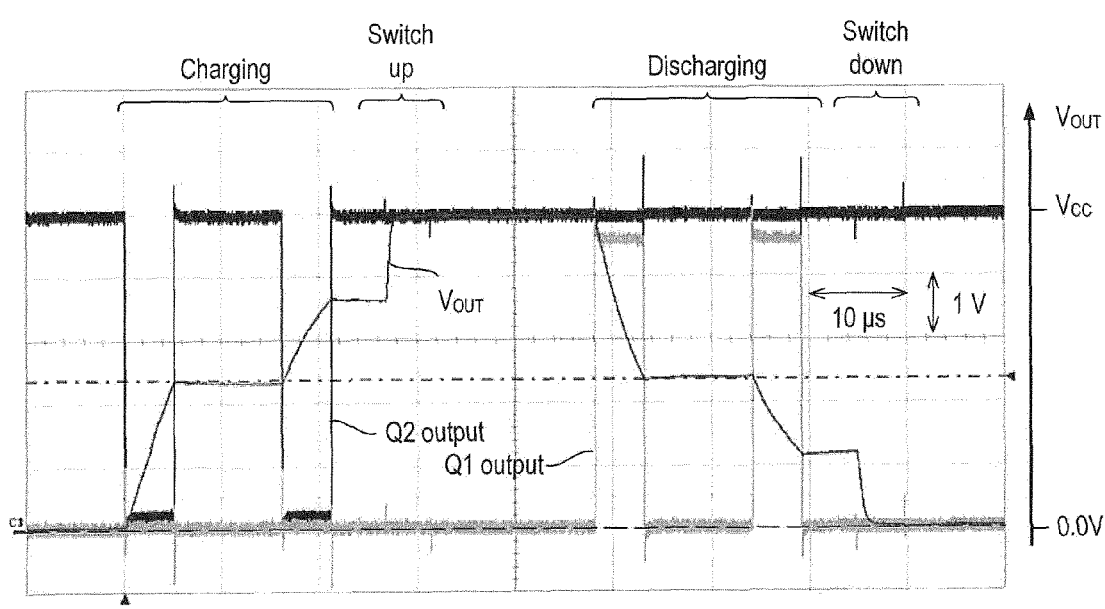
FIG. 20 shows plots of measured responses of the first, transistor, second transistor and the capacitor shown in FIG. 1 when charging and discharging.

FIG. 20 shows plots of voltage against time of the output of the first transistor 11, the output of the second transistor Q2 and the voltage output, $V_{OUT}$, as the capacitor C is charged, set (i.e. switched up), discharged and reset (i.e. switched down).

It will be appreciated that many modifications may be made to the embodiments hereinbefore described.

The first, second, third and fourth transistors Q1, Q2, Q3, Q4 may be replaced by other forms of switching elements.

The first, second, third and fourth transistors Q1, Q2, Q3, Q4 need not be bipolar junction transistors. For example, one, more or all of the transistors Q1, Q2, Q3, Q4 may be metal-oxide-semiconductor field effect transistors (MOSFETs).

If the control signals are inverted, the conductivity types of the transistors Q1, Q2, Q3, Q4 can be inverted. For example, the first and third transistors Q1, Q3 can be npn transistors and the second and fourth transistors Q2, Q4 can be pnp transistors.

The capacitor C may have another, different value, for example, up to 100 nF or more.

The ninth resistor R9 may have a value other than 510Ω and may have a value which is different from the first, third, fifth and/or seventh resistors R1, R3, R5, R7.

The first, third, fifth and seventh resistors R1, R3, R5, R7 may have values other than 510Ω and need not all have the same values.

The second, fourth, sixth and eight resistors R2, R4, R6, R8 may have values other than 90Ω and need not all have the same values.

A resistor may be placed in the series with first transistor Q1, between the capacitor C and the first rail 7, provided that the resistor has a lower value than the resistance of the ninth resistor R9, for example, no more than half the value of the ninth resistor R9.

A resistor may be placed in the series with third transistor Q3, between the capacitor C and second rail 8, provided that the resistor has a lower value than the resistance of the ninth resistor R9, for example, no more than half the value of the ninth resistor R9.

The circuit can be controlled using a simple control circuit which includes a voltage reference which provides a voltage reference signal, a comparator which compares the voltage reference signal and the voltage output to provide a timer interrupt, a timer, for example a 555 timer, provides timer signals.

A logic gate need not be used to provide a propagation delay. A delay line (for example formed by RC elements), analog or digital elements may be used.

The invention claimed is:

1. Apparatus comprising:
   a digital-to-analog converter comprising:
      a resistor having a resistance R;
      a capacitor having a capacitance C;
      a first switching element which couples the capacitor to a first rail via a path having a resistance less than R in response to a first control signal;
      a second switching element which couples the capacitor to the first voltage rail through the resistor in response to a second control signal;
      a third switching element which couples the capacitor to a second rail via a path having a resistance less than R in response to a third control signal, and
      a fourth switching element which couples the capacitor to the second rail through the resistor in response to a fourth control signal;
   and a microcontroller which provides and/or causes generation of the control signals to generate an analog output signal based on a digital input signal,
   wherein a control signal is applied for a duration less than RC.

2. Apparatus according to claim 1, comprising:
   a first control element which switches on the second switching element before switching on the first switching element; and
   a second control element which switches on the fourth switching element before switching on the third switching element.

3. Apparatus according to claim 2, wherein the first and second control elements introduce first and second propagation delays respectively.

4. Apparatus according to claim 3, wherein the first and/or second propagation delay(s) is (are) no more than 50 ns, no more than 20 ns or no more than 10 ns.

5. Apparatus according to claim 3, wherein the first and/or second propagation delay(s) is (are) at least 1 ns, at least 2 ns or at least 5 ns.

6. Apparatus according to claim 1, comprising:
   a first path between a control signal input and a control terminal of the first switching element via an element which introduces a first delay; and
   a second path between the control signal input and a control terminal of the second switching element without an element which introduces a delay or via an element which introduces a delay less than the first delay.

7. Apparatus according to claim 1, comprising:
   a third path between another control signal input and a control terminal of the third switching element via another element which introduces a second delay; and
   a fourth path between the other control signal input and a control terminal of the fourth switching element without an element which introduces a delay or via an element which introduces a delay less than the second delay.

8. Apparatus according to claim 1, wherein the first switching element couples the capacitor directly to the first rail.

9. Apparatus according to claim 1, wherein the third switching element couples the capacitor directly to the second rail.

10. Apparatus according to claim 1, comprising a single capacitor between the first and second rails.

11. Apparatus according to claim 1, wherein the first control element provides the first control signal in dependence upon the second control signal and a fifth control signal.

12. Apparatus according to claim 1, wherein the first control element comprises a logic gate.

13. Apparatus according to claim 1, wherein the second control element provides the third control signal in dependence upon the fourth control signal and a sixth control signal.

14. Apparatus according to claim 1, wherein the second control element comprises a logic gate.

15. Apparatus according to claim 1, wherein the first and third switching elements are arranged in a push-pull configuration.

16. Apparatus according to claim 1, wherein the first and third switching elements comprise first and third transistors.

17. Apparatus according to claim 16, wherein the first and third transistors comprise bipolar junction transistors.

18. Apparatus according to claim 1, wherein the second and fourth switching elements are arranged in a push-pull configuration.

19. Apparatus according to claim 1, wherein the second and fourth switching elements comprise second and fourth transistors.

20. Apparatus according to claim 19, wherein the second and fourth transistors are bipolar junction transistors.

21. A method of controlling an apparatus, the apparatus comprising a resistor having a resistance R, a capacitor having a capacitance C and at least one switching element which couples the capacitor to a voltage rail through the resistor in response to a control signal, and a microcontroller which provides and/or causes generation of the control signal, the method comprising:
   applying the control signal for a duration less than RC,
   when the capacitor is in a discharged state, initially charging the capacitor through the resistor for a given time period and then charging the capacitor via a path having a resistance less than R, and
   when the capacitor is in charged state, initially discharging the capacitor through the resistor for a given time period and then discharging the capacitor via a path having a resistance less than R.

22. A method of controlling an apparatus, the apparatus comprising a first switching element which couples the capacitor to a first rail via a path having a resistance less than R in response to a first control signal, a second switching element which couples the capacitor to the first voltage rail through the resistor in response to a second control signal, a third switching element which couples the capacitor to a second rail via a path having a resistance less than R in response to a third control signal, and a fourth switching element which couples the capacitor to the second rail through the resistor in response to a fourth control signal, and a microcontroller which provides and/or causes generation of the control signal, wherein the method comprises:

applying the first, second, third or fourth control signal for a duration less than RC.

* * * * *